United States Patent
Yu et al.

(10) Patent No.: US 7,408,485 B1
(45) Date of Patent: Aug. 5, 2008

(54) ASYNCHRONOUS SAMPLING RATE CONVERTER AND METHOD FOR AUDIO DAC

(75) Inventors: Shawn Xianggang Yu, Austin, TX (US); Terry L. Sculley, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/726,414

(22) Filed: Mar. 22, 2007

(51) Int. Cl.
   *H03M 7/00* (2006.01)
(52) U.S. Cl. ............ 341/61; 708/313; 708/300
(58) Field of Classification Search .......... 341/123, 341/61; 375/372; 708/300, 313
   See application file for complete search history.

(56) References Cited

U.S. PATENT DOCUMENTS

| | | | | |
|---|---|---|---|---|
| 5,119,093 A | * | 6/1992 | Vogt et al. ............ | 341/123 |
| 5,475,628 A | * | 12/1995 | Adams et al. .......... | 708/313 |
| 5,666,299 A | * | 9/1997 | Adams et al. .......... | 708/300 |
| 6,531,970 B2 | * | 3/2003 | McLaughlin et al. ... | 341/61 |
| 2004/0120361 A1 | | 6/2004 | Yu et al. ............... | 370/545 |
| 2004/0184573 A1 | * | 9/2004 | Andersen et al. ...... | 375/372 |

* cited by examiner

*Primary Examiner*—Jean B Jeanglaude
(74) *Attorney, Agent, or Firm*—Wade J. Brady, III; Frederick J. Telecky, Jr.

(57) ABSTRACT

A sample rate converter suitable for use in an audio DAC includes a first estimating circuit (32A) generating first (TR) and second (STAMPR) signals synchronized to an asynchronous clock (MCLK) and representing the period and edge arrival times, respectively, of a reference clock (REFCLK). A second estimating circuit (32B) operates on the first and second signals to generate third (T1) and fourth (STAMP1) signals representing an input sample rate (32fsin) and arrival times of input data samples, respectively, which are applied to a coefficient and address generator (76) to generate read addresses and coefficients input to a FIFO memory (42) receiving digital input data at the input sample rate and a multiplication/accumulation circuit (78) receiving data from the FIFO memory. The multiplication/accumulation circuit produces an output signal (SRC-out) synchronized to the asynchronous clock at an output sample rate (32fsout).

20 Claims, 6 Drawing Sheets

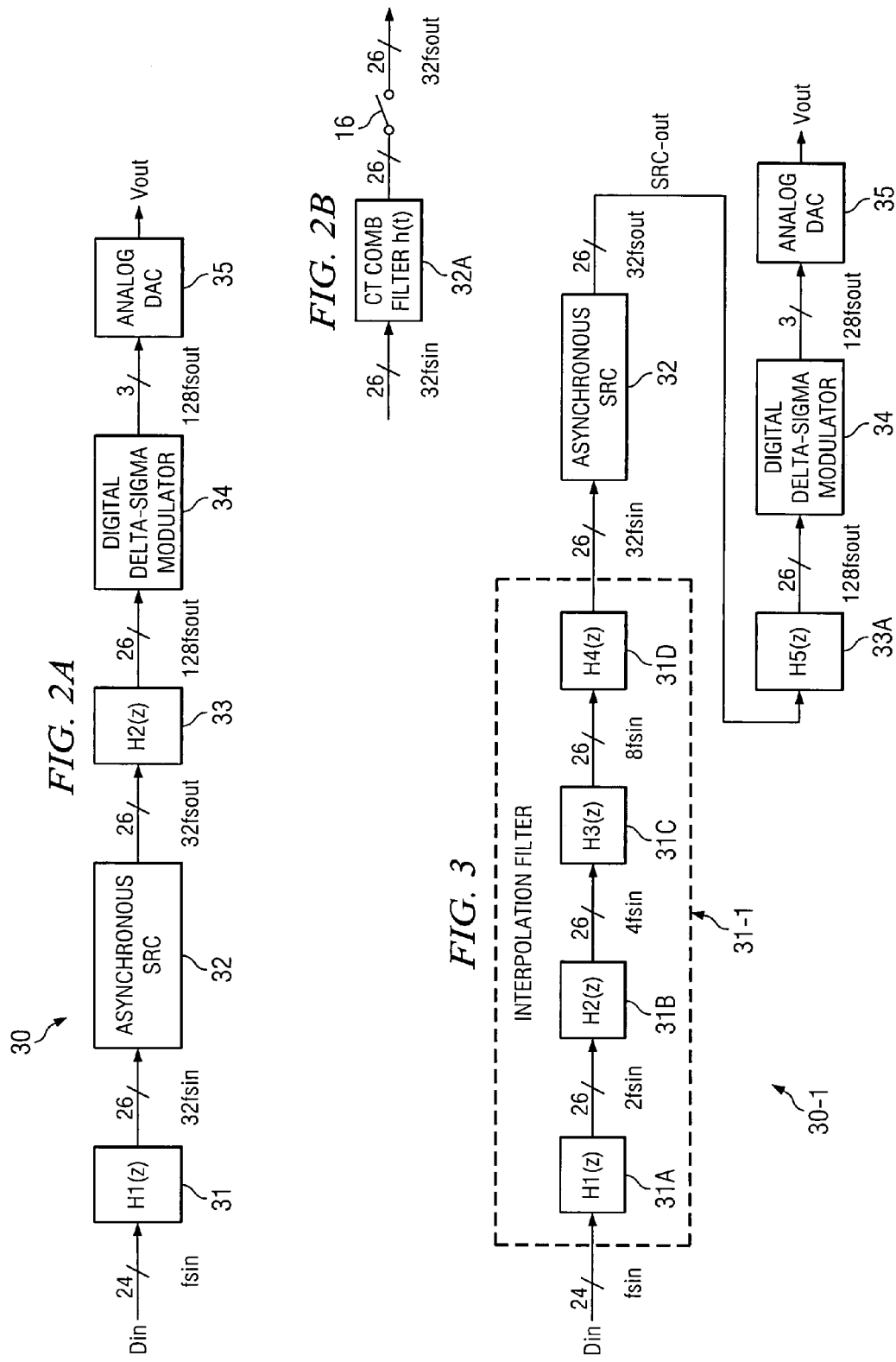

a=0.5T1/T2, T2=32 for MCLK=256fsout

ASYNCHRONOUS SAMPLING RATE CONVERTER AND METHOD FOR AUDIO DAC

BACKGROUND OF THE INVENTION

The present invention relates generally to use of sample rate converters, and more particularly to use of sample rate converters in audio digital to analog converters ("audio DACs") in which the audio DAC is not required to be locked in synchronization with the sampling rate of the audio input data.

An audio DAC ordinarily consists of two parts, including a digital signal processing circuit which interpolates (and sometimes performs other processing on) the incoming audio data. The interpolated data may be processed by a digital delta-sigma modulator, the output of which typically is provided as an input to an analog DAC. In conventional audio DACs, the audio data is interpolated by multi-stage interpolation filters and then is fed into a digital delta-sigma modulator. The digital delta-sigma modulator is used to reduce the audio data word width and push quantization noise out of the audio band to reduce distortion caused by nonlinearity of an analog DAC section of the audio DAC. The reduced width audio data words are converted into analog signals by the analog DAC circuitry.

As it becomes more common to store and process audio signals in digital format, the number of applications of audio DACs is rapidly increasing. Various analog audio sources often are sampled at various different sample frequencies and the sampled signals then are digitized to produce various digital audio signals. In digital format, the audio signals can be edited, reproduced and processed easily without introducing nearly as much distortion and noise as would be introduced if the same editing, reproducing and processing were to be performed on the same audio signals in analog format. Also, audio DACs are widely used in applications in which the digital audio samples are played back through speakers and headphones.

Ordinarily, audio DACs operate at clock signal rates that are locked in synchronization with the digital audio input sampling rates, in order to avoid pitch shift artifacts. The effect of the pitch shift artifacts is that the tone at the analog output is not exactly at the frequency it is supposed to be. For example, if the DAC is operating at 48.5 kHz while playing a 1 kHz tone recorded at 48 kHz, the tone at the DAC output will be 1.01 kHz instead of 1 kHz. There are several typical sampling rates for digital audio data, so clock signals related to those typical sampling rates need to be available for clocking the audio DACs to enable them to "play back" the received digital audio at different audio sampling rates. To achieve high quality audio output, the clock signals being utilized need to have low jitter. The jitter of the DAC clock has an FM modulation effect on the audio signals. For example, if the jitter is sinusoidal and the playback audio signal is a tone, there will be two "side tones" at each side of the main audio tone, and the distance of each side tones to the main audio tone is equal to the jitter frequency. In some applications, it is difficult to provide analog DAC clock signals that meet the foregoing requirements. That is, a low jitter clock signal having a frequency related to the audio sampling rate is not conveniently available in some applications.

Also, normally in the prior art a clock signal having a frequency that is directly related to the sampling rate is needed. Otherwise, a PLL (phase locked loop) must be used to generate a sampling-rate-related clock from a clock that is not directly related to the sampling rate. However, it would be highly desirable for some audio DAC applications that any reference signal, such as the output of a free-running oscillator, could be used for controlling the operating rate of the analog DAC section of the audio DAC.

Sample rate converters are necessary for interfacing between devices receiving and/or producing digital signals having different sample rates, in order to avoid audio sample dropping or sample repeating which result in highly undesirable audible "popping" or "clicking" sounds. Even for two devices that receive and/or produce digital signals having the same nominal sample rates but which are based on asynchronous clocks, it is necessary to use an asynchronous sample rate converter to accomplish interfacing between the two devices in order to avoid audio sample dropping or repeating.

In asynchronous sample rate converters it is not necessary that the sample rate of the output signal be synchronized with the sample rate of the input signal. Asynchronous sample rate converters each receive a stream of input samples, process them, and produce output samples when requested, and can be used to convert between any two sample rates irrespective of whether the ratio of the two sample rates is an integer or is a rational number, and irrespective of whether the two sample rates are synchronized.

Because of this feature, an asynchronous sample rate converter can decouple a first digital audio device producing a digital output having a first sample rate from a second digital audio device which is intended to receive the output of the first digital audio device and sample it at a second sample rate. For example, the sample rate of an audio source device might be 48 kHz, and the desired sample rate for an audio destination device might also be 48 kHz, but the clock signals of the audio source device and the audio destination device might be independent and therefore asynchronous. In this case, even though the nominal sample rates both are 48 kHz, a very small drift or difference between the frequencies of the two above-mentioned 48 kHz clock signals will accumulate and cause the above-mentioned undesirable/annoying sample dropping or sample repeating if a synchronous sample rate converter is used.

The prior art is believed to be partially indicated in the assignee's co-pending patent application "ASYNCHRONOUS SAMPLE RATE CONVERTER AND METHOD" Ser. No. 10/325,202, filed Dec. 20, 2002 by Xianggang Yu, Terry L. Sculley and Jung-Kuei Chang, Published Jun. 24, 2004 as Publication No. US 2004/0120361 A1, incorporated herein by reference.

FIG. 1 of the foregoing reference is reproduced herein as "Prior Art" FIG. 1, which shows an asynchronous sample rate converter 1 wherein a memory 6 receives samples representative of the input signal and stores samples thereof at locations determined by a write address wraddr and presents stored samples from locations determined by a read address rdaddr. The presented samples are passed through an interpolation and resampling circuit 7 to produce a continuous-time signal y6 which is re-sampled to produce a signal y7 that is up-sampled relative to a desired output. That signal then is filtered and down-sampled to produce the output signal y. Sample rate estimating circuitry in block 2 computes a difference signal td representative of a time at which a data sample of the audio input signal is received and a time at which a corresponding audio output sample is required, and address generation circuitry generates the read address in response to the difference signal.

A coefficient calculation circuit in block 2 calculates filter coefficients 3 for the interpolation and resampling circuit in response to the difference signal. Asynchronous sample rate converter 1 includes interpolation filtering circuitry 8A,B for receiving a digital audio input signal x having an input sample rate fsin and producing a filtered, up-sampled first signal y2 having a first sample rate 4fsin, and a FIFO (first in, first out) memory 6 for receiving the first signal y2 and storing samples thereof at locations determined by a write address wraddr and presenting stored samples y3 from locations determined by a read address rdaddr. Prior art asynchronous sample rate converter 1 also includes interpolation and resampling circuitry 7 for up-sampling and filtering the presented stored samples y3 to produce a continuous-time signal y6 and for resampling the continuous-time signal to produce an up-sampled discrete-time signal y7 relative to the output sampling rate.

A decimation filter 18 filters and down-samples the discrete-time signal y7 to produce an audio output signal y having an output sampling rate fsout. Asynchronous sample rate converter 1 also includes sample rate estimating circuitry responsive to a main clock MCLK, an input sample rate clock LRIN, and an output sample rate clock LROUT for a computing a difference signal representative of a time at which a data sample of the audio input signal is received and a time at which a corresponding audio output sample is required. Address generation circuitry responsive to an input sampling clock LRIN and the integer part generates the read address rdaddr.

There is an unmet need for a way to more easily utilize audio DACs without requiring the operating frequency of an analog DAC section of the audio DAC to be synchronized with the sampling rate of the audio data.

There also is an unmet need for a way to more easily utilize audio DACs without requiring that a reference signal indicating the audio input data sampling rate be exactly the same as the actual audio output data sampling rate signal.

There also is an unmet need for a way to more easily utilize audio DACs wherein a reference signal of any frequency can be used if the ratio of the reference signal frequency to the audio input data sampling rate is provided.

There also is an unmet need for an audio DAC which does not require an external high-speed operating clock.

SUMMARY OF THE INVENTION

It is an object of the invention to provide a way to more easily utilize audio DACs without requiring the operating frequency of an analog DAC section of the audio DAC to be synchronized with the sampling rate of the audio data.

It is another object of the invention to provide a way to more easily utilize audio DACs without requiring that a reference signal indicating the audio input data sampling rate be exactly the same as the actual audio output data sampling rate signal.

It is another object of the invention to provide a way to more easily utilize audio DACs wherein a reference signal of any frequency can be used as long as the ratio of the reference signal frequency to the audio input data sampling rate is provided.

It is another object of the invention to provide an audio DAC and method which reduce the power consumption of a system including the audio DAC.

It is another object of the invention to provide an audio DAC which does not require either an external high frequency operating clock signal or an on-chip phase locked loop circuit.

Briefly described, and in accordance with one embodiment, the present invention provides a sample rate converter suitable for use in an audio DAC, including a first estimating circuit (32A) generating first (TR) and second (STAMPR) signals synchronized to an asynchronous clock (MCLK) and representing the period and edge arrival times, respectively, of a reference clock (REFCLK). A second estimating circuit (32B) operates on the first and second signals to generate third (T1) and fourth (STAMP1) signals representing an input sample rate (32fsin) and arrival times of input data samples, respectively, which are applied to a coefficient and address generator (76) to generate read addresses and coefficients input to a FIFO memory (42) receiving digital input data at the input sample rate and a multiplication/accumulation circuit (78) receiving data from the FIFO memory. The multiplication/accumulation circuit produces an output signal (SRC-out) synchronized to the asynchronous clock at an output sample rate (32fsout).

In one embodiment, the invention provides a digital conversion circuit receiving digital input data (Dinf) at a first sample rate (fsin) and including a first estimating circuit (32A) receiving a reference clock signal (REFCLK) and a first clock signal (MCLK) unrelated to the reference clock signal (REFCLK) for generating a first signal (TR) in synchronization with the first clock signal (MCLK) and representative of a period of the reference clock signal (REFCLK) and for generating a second signal (STAMPR) in synchronization with the first clock signal (MCLK) and representative of a time of arrival of a particular edge of the reference clock signal (REFCLK). A second estimating circuit (32B) operates on the first signal (TR), the second signal (STAMPR), and an input value (RATIO) representing a predetermined ratio of the frequency (1/TR) of the reference clock signal (REFCLK) divided by the first sample rate (fsin) to generate a third signal (T1) which represents a period of the first sample rate (32fsin) and a fourth signal (STAMP1) that represents a time of arrival of samples of a group of the digital input data (Dinf). A coefficient and address generation circuit (76) receiving the third (T1) and fourth (STAMP1) signals generates a read address signal and a coefficient signal (coef). A FIFO memory (42) having an input coupled to receive the digital input signal (Dinf) and a read address input receives the read address signal, and a multiplication/accumulation circuit (78) receives the coefficient signal (coef) and digital data samples output by the FIFO memory (42) through a zero-order sample and hold circuit (66) which does not require any additional circuitry and multiplies the digital data samples output by the FIFO memory (42) by corresponding coefficients (coef) output by the coefficient and address generation circuit (76). The multiplication/accumulation circuit accumulates resulting multiplication products, and produces a digital output signal (SRC-out) including accumulated multiplication products and having an output sample rate (32fsout) that is synchronized with the first clock signal (MCLK).

In a described embodiment, the first clock signal (MCLK) is derived from a signal produced by a clock signal derived from a signal (OSCLK) produced by a free-running oscillator (63) included on an integrated circuit chip with the conversion circuit.

In a described embodiment, the first estimating circuit (32A) includes a counter (68) clocked by the first clock signal (MCLK) producing a counter output signal (COUNT) coupled to a data input of a latch circuit (70), an edge detection circuit (69) having an input receiving the reference clock signal (REFCLK) and an output coupled to a latching input of the latch circuit (70), and a loop filter (71) having an input coupled to an output of the latch circuit (70), a first output on which the first signal (TR) is produced, and a second output on which the second signal (STAMPR) is produced. The second estimating circuit (32B) includes an input for receiving the input value (RATIO) which represents the predetermined ratio of the frequency (1/TR) of the reference clock signal (REFCLK) divided by a first sample rate (fsin), and also includes a first multiplier (74) which multiplies the first signal (TR) by the input value (RATIO) to generate the third signal (T1).

In a described embodiment, the second estimating circuit (32B) includes a first adder (75) having a first input coupled to receive the input value (RATIO) and an output (75A) coupled to a first input of a second multiplier (73) having a second input coupled to receive the first signal (TR) and an output coupled to a first input of a second adder (72) having a second input coupled to receive the second signal (STAMPR) and an output on which the fourth signal (STAMP1) is produced. The output (75A) of the first adder (75) also is coupled to a first input of a first multiplexer (81) and an input of a decision circuit (79) having an output coupled to a selection input of the first multiplexer (81). The first multiplexer (81) has an output coupled to a first input of a second multiplexer (83), the second multiplexer (83) has an output coupled to an input of an accumulator (84). The accumulator (84) has an output (85) coupled to a second input of the first adder (75), a second input of the first multiplexer (81), and a first input of a third adder (82) having a second input coupled to receive a value −1.0. The third adder has an output coupled to a second input of the second multiplexer (83). The decision circuit (79) produces an output signal indicative of whether the contents of the decision circuit (79) is less than 1.0. The first (75) and third (82) adders, the decision circuit (79), and the accumulator (84), and the first (81) and second (83) multiplexers co-act to perform the function of generating timing information for operating on the digital input data based on the sample clock (REFCLK) and the first signal (TR).

In a described embodiment, the coefficient and address generation circuit (76) includes a divider circuit (68-1) which divides the first clock signal (MCLK) to produce an output clock signal having a sample rate (32fsout) coupled to a latching input of a second latch circuit (70-1). The second latch circuit (70-1) has an input coupled to receive the counter output signal (COUNT) and an output coupled to a (+) input of a first adder (97) having a (−) input coupled to receive the fourth signal (STAMP1). The first adder (97) has an output which is divided by the third signal (T1) to produce a timing difference signal (tdiff) which includes an integral portion coupled to address generating circuitry of the coefficient and address generation circuit (76) and a fractional portion coupled to coefficient generating circuitry of the coefficient and address generation circuit (76). The address generating circuitry includes a multiplexer (101) having a first input coupled to receive a sum of a first write address and the integral portion of the timing difference signal (tdiff) and an output coupled to an input of a register (102) having an output coupled to a read address input of the FIFO memory (42) and to an input of a decrement by 1 circuit (103), the decrement by 1 circuit (103) being coupled to a second input of the multiplexer (101). The coefficient generating circuitry includes a multiplexer (105) has a first input coupled to receive a product of the fractional portion of the timing difference signal (tdiff) and the third signal (T1) and an output coupled to an input of a register (106) having an output coupled to an input of a coefficient generator (108) and to an input of an incrementing circuit (107) which increments by the value of the third signal (T1). The incrementing circuit (107) is coupled to a second input of the multiplexer (105), an output of the coefficient generator (108) generating the coefficients (coef).

In a described embodiment, the coefficient generator (108) generates coefficient signals (coef) in accordance with an impulse response of a third-order continuous-time comb filter, represented by the expressions

| | |
|---|---|
| $h(t) = 0.0$ | for $\tau < 0.0$ |
| $h(t) = \alpha * \tau^2$ | for $0.0 \leq \tau < 1.0$ |
| $h(t) = \alpha(1.5 - 2(\tau - 1.5)^2)$ | for $1.0 \leq \tau < 2.0$ |
| $h(t) = \alpha(3 - \tau)^2$ | for $2.0 \leq \tau < 3.0$ |
| $h(t) = 0.0$ | for $\geq 3.0$, | where $\alpha < 0.5*T1/T2$ and $\tau = t/T2$, and where $T1 = 1/(32fsin)$, $T2 = 1/(32fsout)$, and wherein 32fsin is the first input sample rate and 32fsout is the output sample rate.

In a described embodiment, the digital conversion circuit includes an analog DAC (digital to analog converter) (35) coupled to receive digital information representative of the accumulated multiplication products and converting the digital information to an analog output signal (Vout) representative of the digital input data (Dinf), the analog DAC (35) operating at a frequency (128fsout) that is unrelated to and not synchronous with respect to the input sample rate (fsin). A digital delta-sigma modulator (34) receives the digital information and generates a reduced-width digital output signal coupled to an input of the analog DAC (35). The reduced-width digital output signal generated by the digital delta-sigma modulator (34) has fewer bits than the digital output signal (SRC-out) produced by the multiplication/accumulation circuit (78). The digital delta-sigma modulator (34) and the analog DAC (35) are clocked by a signal (OUTCLK) which is derived from the signal (OSCLK) produced by the free-running oscillator (63).

In one embodiment, the invention provides a method of operating a digital conversion circuit receiving digital input data (Dinf) having a first sample rate (fsin), including generating both a first signal (TR) representative of a period of a reference clock signal (REFCLK) in synchronization with a first clock signal (MCLK) unrelated to the reference clock signal (REFCLK) and a second signal (STAMPR) in synchronization with the first clock signal (MCLK) and representative of a time of arrival of a particular edge of the reference clock signal (REFCLK) by latching outputs of a counter (68) triggered by the first clock signal (MCLK) into a first latch circuit (70) in response to the reference clock signal (REFCLK) and filtering outputs of the latch circuit (70), generating a third signal (T1) which represents a period of the first sample rate (32fsin) by multiplying the first signal (TR) by an input value (RATIO) which represents a predetermined ratio of the frequency (1/TR) of the reference clock signal (REFCLK) divided by the first sample rate (fsin), and operating on the first signal (TR) and the second signal (STAMPR) to generate a fourth signal (STAMP1) that represents a time of arrival of a group of samples of the digital input data (Dinf), operating on the third (T1) and fourth (STAMP1) signals to generate read address signals and coefficient signals (coef), applying the read address signals to a FIFO memory (42) having an input coupled to receive the digital input data (Dinf), and multiplying digital data samples output by the FIFO memory (42) by corresponding coefficients (coef), accumulating the resulting multiplication products, and producing a digital output signal (SRC-out) including accumulated multiplication products and having an output sample rate (32fsout) that is synchronized with the first clock signal (MCLK). The first clock signal (MCLK) is derived from a signal (OSCLK) produced by a free-running oscillator (63). The first clock signal (MCLK) is divided down to produce an output clock signal having the sample rate (32fsout) and outputs of the counter (68)) are latched, outputs of a second latch circuit (70-1) are subtracted from the fourth signal (STAMP1), the resulting difference is divided by the third signal (T1) to produce a timing difference signal (tdiff) which includes an integral portion and a fractional portion, using the integral portion to generate the read address signals, and using the fractional portion to generate the coefficient signals. The integral portion of the timing difference signal (tdiff) is added to write addresses and results of the adding are successively decremented to generate read addresses for successive samples of the digital input data (Dinf). The fractional portion of the timing difference signal (tdiff) is multiplied by the third signal (T1) and the product is successively incremented to produce inputs to a coefficient generator circuit (108) to cause the coefficient generator circuit (108) to generate coefficients for the successive samples of the digital input data (Dinf), respectively.

In one embodiment, the invention provides a digital conversion circuit receiving digital input data (Dinf) having a first sample rate (fsin), including means for generating both a first signal (TR) representative of a period of a reference clock signal (REFCLK) in synchronization with a first clock signal (MCLK) unrelated to the reference clock signal (REFCLK) and a second signal (STAMPR) in synchronization with the first clock signal (MCLK) and representative of a time of arrival of a particular edge of the reference clock signal (REFCLK) by latching outputs of a counter (68) triggered by the first clock signal (MCLK) into a latch circuit (70) in response to the reference clock signal (REFCLK) and filtering outputs of the latch circuit (70), means for generating a third signal (T1) which represents a period of the first sample rate (32fsin) by multiplying the first signal (TR) by an input value (RATIO) which represents a predetermined ratio of the frequency (1/TR) of the reference clock signal (REFCLK) divided by the first sample rate (fsin), and operating on the first signal (TR) and the second signal (STAMPR) to generate a fourth signal (STAMP1) that represents a time of arrival of a group of samples of the digital input data (Dinf), means for operating on the third (T1) and fourth (STAMP1) signals to generate read address signals and coefficient signals (coef), means for applying the read address signals to a FIFO memory (42) having an input coupled to receive the digital input data (Dinf), and means for multiplying digital data samples output by the FIFO memory (42) by corresponding coefficients (coef), accumulating the resulting multiplication products, and producing a digital output signal (SRC-out) including accumulated multiplication products and having an output sample rate (32fsout) that is synchronized with the first clock signal (MCLK).

BRIEF DESCRIPTION OF THE DRAWINGS

FIG. 2A is a generalized block diagram of an audio DAC of the present invention.

FIG. 2B is a block diagram of a continuous-time (CT) comb filter included in the SRC of FIG. 2A.

FIG. 3 is a block diagram showing in more detail in the interpolation filtering in the audio DAC of FIG. 2A.

DETAILED DESCRIPTION OF THE PREFERRED EMBODIMENTS

Figure 1:
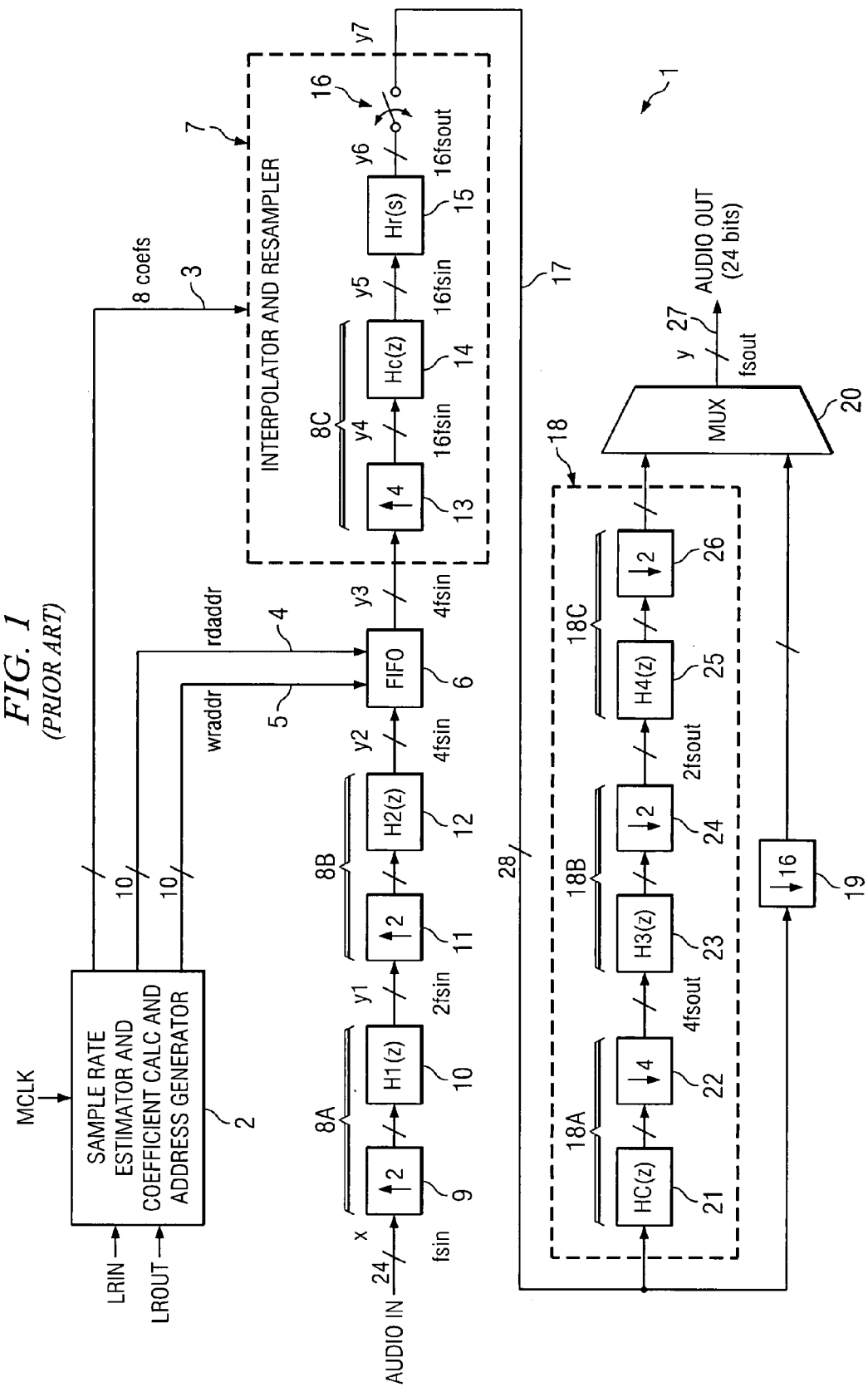
FIG. 1 is a details block diagram of a Prior Art asynchronous SRC.

FIG. 2A shows an "audio DAC" 30 including an interpolation circuit 31 having a transfer characteristic $H1(z)$. To reduce the complexity of the asynchronous sampling rate converter (SRC) 32 thereof, the audio input data is interpolated before the sampling rate conversion. Interpolation filter 31 up-samples the 24-bit digital input data signal Din from an audio input sample rate fsin to produce a 26-bit signal with a sample rate of 32fsin, z being the operator of a z transforms for discrete-time systems and signals. The output of interpolation circuit 31 is applied to the input of asynchronous SRC 32, which as subsequently explained, is clocked by a reference clock signal (e.g., the REFCLK signal in subsequently described FIGS. 4A-D and 5) which can be derived from a 32.768 kHz clock signal SLEEPCLK commonly used in cell phones. SRC 32 also is clocked in response to a clock signal OSCLK generated by an on-chip oscillator 63 (shown in FIG. 5). SRC 32 converts its input signal sample rate 32fsin to an output sample rate 32fsout. The sample rate 32fsin at the output of the 26-bit output of interpolation circuit 31 and the 26-bit output sample rate 32fsout of asynchronous SRC 32 are asynchronous, meaning that there is no fixed ratio between the two.

The 26-bit output of asynchronous SRC 32 is connected to the input of another interpolation circuit 33 having a transfer characteristic $H2(z)$ which represents a zero order hold (ZOH) interpolation filter function wherein its input signal is up-sampled by a factor of 4 to provide a 26-bit output signal with a sample rate of 128fsout. The zero order hold function is a way to separate samples and is the easiest way to interpolate samples. Interpolation circuit 33 can be basically a zero-order sample/hold circuit. The 26-bit output of interpolation circuit 33, with its sampling rate of 128fsout, is coupled to the input of a digital delta-sigma modulator ("digital DSM"), which operates to truncate the audio data received from interpolation circuit 33. The output of digital delta-sigma modulator 34 is a 3-bit or 4-bit signal having a sample rate of 128fsout, which is applied to the input of an analog DAC (digital to analog converter) 35, the output of which produces an analog output signal Vout. Most audio DACs include a digital delta-sigma modulator, and those skilled in the art can readily provide various suitable implementations thereof.

Ordinarily, after Din has been processed by the sequence of interpolation filter 31, asynchronous SRC 32 and interpolation filter 33, the number of bits (i.e., the data width) in each sample of the resulting audio signal will be about 28-32. (The data width can be any number, subject to the requirement that it has to be wide enough to ensure the desired SNR (signal-to-noise ratio) and the desired THD (total harmonic distortion) performance.) The 28-32 bit audio signal should not be input directly to the analog DAC 35 because of linearity problems typical of delta-sigma techniques.

Therefore, digital delta-sigma modulator 34 is used to truncate the data word width from 26-32 bits to 3 or 4 bits. This truncated 3 or 4 bit, 128fsout sample rate signal produced by digital delta-sigma modulator 34 in this example is provided as the input to analog DAC 35. (An analog DAC's linearity becomes worse with increasing input data levels because of inherent analog circuit limitations. One way to solve this problem is to use a delta-sigma modulator such that its output has only a few levels (for example, 5 levels) because of the truncation, wherein the resulting truncation noise is "pushed out" of the signal band by the delta-sigma modulator.)

FIG. 2B shows a third-order continuous-time comb filter implementation of a portion of asynchronous SRC 32 of FIG. 2A. The mathematical formulas T1=1/(32fsin) and T2=1/(32fsout) for the input period are used in the process of converting the input sample rate to the output sample rate. The output sampling switch 16 is similar to the sampling switch 16 shown in Prior Art FIG. 1. In audio DAC 30 of FIGS. 2 and 3, there is no further filter following sampling switch 16 (which is in contrast to Prior Art FIG. 1). The impulse response of the third-order continuous-time comb filter of FIG. 2B is:

| | |
|---|---|
| $h(t) = 0.0$ | for $\tau < 0.0$ |
| $h(t) = \alpha * \tau^2$ | for $0.0 \leq \tau < 1.0$ |
| $h(t) = \alpha(1.5 - 2(\tau - 1.5)^2)$ | for $1.0 \leq \tau < 2.0$ |
| $h(t) = \alpha(3 - \tau)^2$ | for $2.0 \leq \tau < 3.0$ |
| $h(t) = 0.0$ | for $\geq 3.0$, | where $\alpha \leq 0.5 * T1/T2$ and $\tau \equiv t/T2$. (This impulse response indicates what the filter output waveform looks like in response to a discrete-time unit sample. The impulse response represents the mathematical filtering process, and is used to generate the filter output from its input samples.

FIG. 3 shows a more detailed implementation 30-1 of the audio DAC 30D in as shown in FIG. 2A. In FIG. 3, interpolation filter 31-1 includes 4 interpolation stages 31A, 31B, 31C, and 31D having the transfer characteristics H1(z), H2(z), H3(z), and H4(z), respectively, which operate to increase the sampling rate of the 24-bit parallel data input signal Din from fsin to 32fsin. (Note that this function is performed by interpolator 31 alone in audio DAC 30 of FIG. 2A.) Block 33A in FIG. 3 corresponds to block 33 in FIG. 2A, and also performs a zero-order-hold function. The output of interpolation stage 31D is connected to the input of asynchronous SRC 32, the output of which is a 26-bit signal having a sampling rate of 32fsout. The output of asynchronous SRC 32 is applied to the input of interpolation stage 33A, which has a transfer characteristic H5(z). The output of interpolation stage 33A is applied to the input of digital delta-sigma modulator 34, the output of which is a 3-bit or 4-bit word that is applied to the input of analog DAC 35. Analog DAC 35 produces corresponding output signal Vout, which can be fed into to a mixer (not shown) or directly into suitable analog output circuitry, as desired. (The number of taps for the various filters in FIG. 3 can vary for different applications.)

Figure 4A:
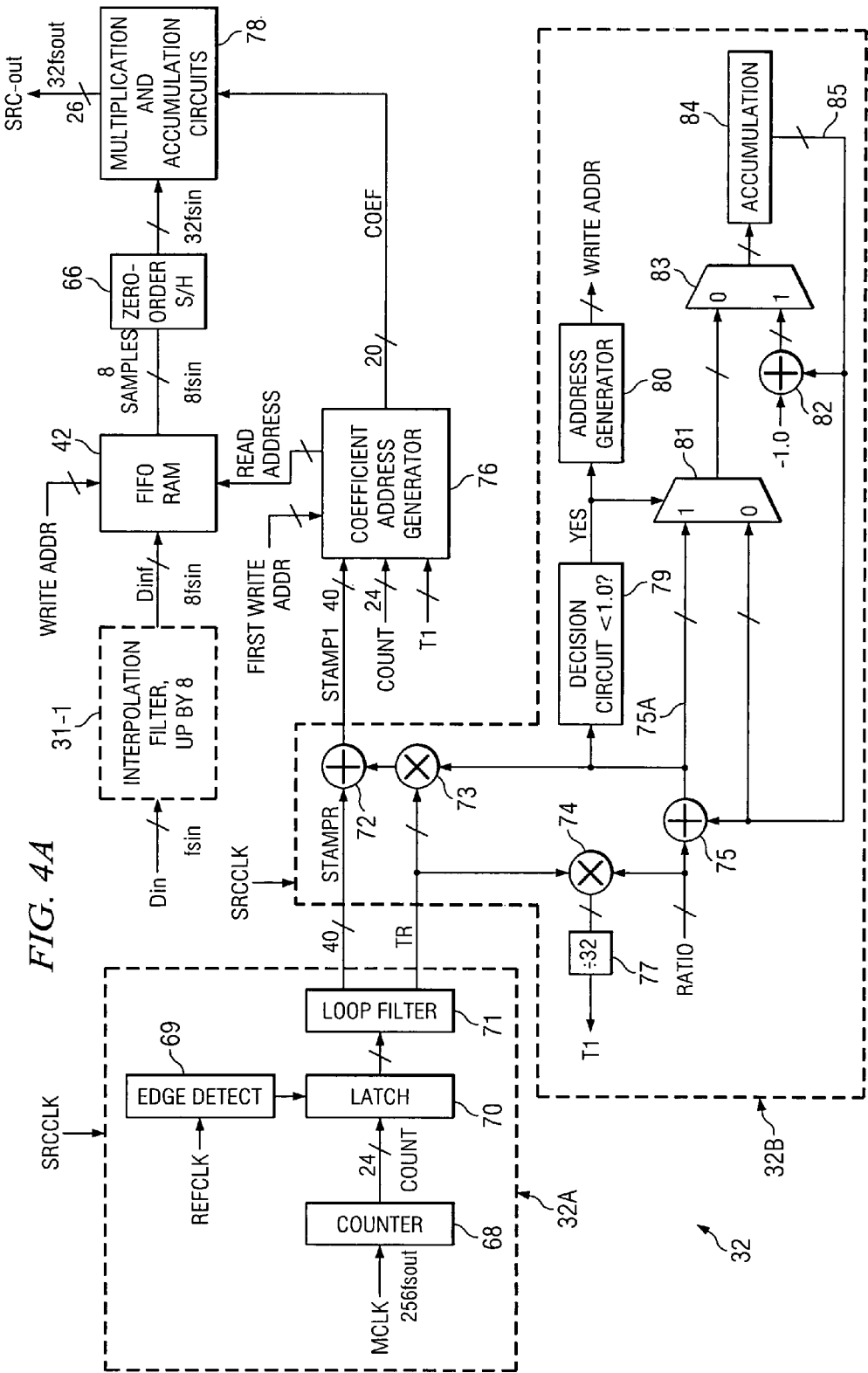
FIG. 4A is a detailed block diagram of the SRC in FIG. 2A.

Referring to FIG. 4A, asynchronous SRC 32 of FIGS. 2A and 3 includes a counter 68 which operates to produce a signal COUNT in response to a master clock signal MCLK, the frequency of MCLK being equal to 256fsout. (See MCLK in subsequently described FIG. 5, wherein MCLK is derived from an on-chip oscillator 63.) Counter 68 continues to repeatedly count to its overflow condition. The rising edge of REFCLK latches the content of counter "COUNT" into loop filter 71. The signal COUNT represents the time of arrival of, for example, the rising edge of REFCLK in terms of the MCLK cycle as the counting unit, and is applied to a data input of a latch 70. Latch 70 has a clock input coupled to the output of an edge detection circuit 69, which detects a rising edge of the reference clock signal REFCLK. The output of latch 70 is applied to an input of a loop filter circuit 71, one output of which produces a "time stamp" signal STAMPR. STAMPR is applied to one input of an adder 72. (Loop filter 71 is similar to one disclosed in the assignee's above-mentioned pending patent application, Publication No. US 2004/0120361 A1.) Time stamp signal STAMPR is a low-pass filtered version of COUNT, and represents the arrival time of the rising edge of REFCLK, with the jitter of REFCLK attenuated and with better resolution of its time of arrival. Another output of loop filter circuit 71 produces a signal TR, which represents the estimated period of REFCLK, measured in units of the clock cycle of MCLK. The signal TR is applied to one input of a multiplier 73 and also to one input of another multiplier 74.

The combination of edge detect circuit 69, counter 68, latch 70, and loop filter 71 are believed to be novel in an SRC, and they can considered to constitute an estimating circuit 32A that generates TR and STAMPR.

A constant value RATIO, which is equal to the ratio between the known frequency of reference clock REFCLK and the basic audio input sampling rate fsin, is applied to another input of multiplier 74 and is also applied to one input of an adder 75. (Therefore, RATIO also is approximately equal to (1/TR)/fsin.) The output of multiplier 74 is connected to the input of a divide-by-32 circuit 77, the output of which produces a signal T1 that represents an estimate of the period of 32fsin, measured in terms of the clock cycle of MCLK, by scaling (i.e., multiplying) the estimated period TR of REFCLK by the value RATIO. Adder 75 produces an output signal 75A on conductor 75A. Conductor 75A is connected to another input of multiplier 73, an input of a decision circuit 79, and the "1" input of a multiplexer circuit 81. The output of decision circuit 79 is connected to a select input of multiplexer 81 and also to an input of an address generation circuit 80, the output of which produces a write address signal WRITE ADDR that is connected to a write address input of FIFO memory 42. When the value of the signal YES produced by decision circuit 79 is a logical "1", the output of multiplexer 81 is selected to be equal to the value of its input signal 75A. The output of multiplexer 81 is connected to the "0" input of a multiplexer circuit 83, an output of which is connected to an input of a register or accumulator 84. The output 85 of accumulator 84 represents the time interval between the last audio sampling data to be played and the last REFCLK arrival in units of the interval of REFCLK, and is coupled by conductor 85 to another input of adder 75, the "0" input of multiplexer 81, and to one input of an adder 82. The other input of adder 82 is connected to receive a signal "−1.0".

The combination of adders 72 and 75, multipliers 73 and 74, decision circuit 79, multiplexers 81 and 83, and accumulator 84 may be considered to be another estimating circuit 32B that performs the function of generating the signal STAMP1 and also generating its period T1, which is a precise estimate of the provided value of 32fsin, as a function of RATIO, which represents the ratio between the frequency of REFCLK and the input audio sampling rate or frequency fsin, and also indirectly represents the operating rate 128fsout of the analog DAC. As previously mentioned, the signal T1 represents an estimated audio input sampling period of 32fsin measured in terms of the clock cycles of MCLK, and is generated by multiplying the estimated period TR of REFCLK by the ratio value RATIO. Estimating circuits 32A and 32B both are clocked by the operating clock signal SRCCLK subsequently described with reference to FIG. 5.

It should be appreciated that normally the user of the audio DAC knows the frequency of REFCLK, and also knows exactly the desired input audio input sample rate fsin. In order to accurately use the frequency of REFCLK to estimate fsin, the user can provide the precise ratio of the frequency of REFCLK relative to fsin. In accordance with the present invention, the free-running oscillator output signal OSCLK is divided down to produce the clock MCLK, and is also used to generate the audio output sampling rate 128fsout which controls the operating rate of analog DAC 35 (see subsequently described FIG. 5). Therefore, MCLK is also related to fsout, and is advantageously used to drive the counter 68 with MCLK. Since REFCLK latches the output of counter 68, the relation between the precisely estimated input sample rate period T1 of 32fsin and the output sample rate 128fsout, which is proportional to fsout, is known.

Figure 4B:
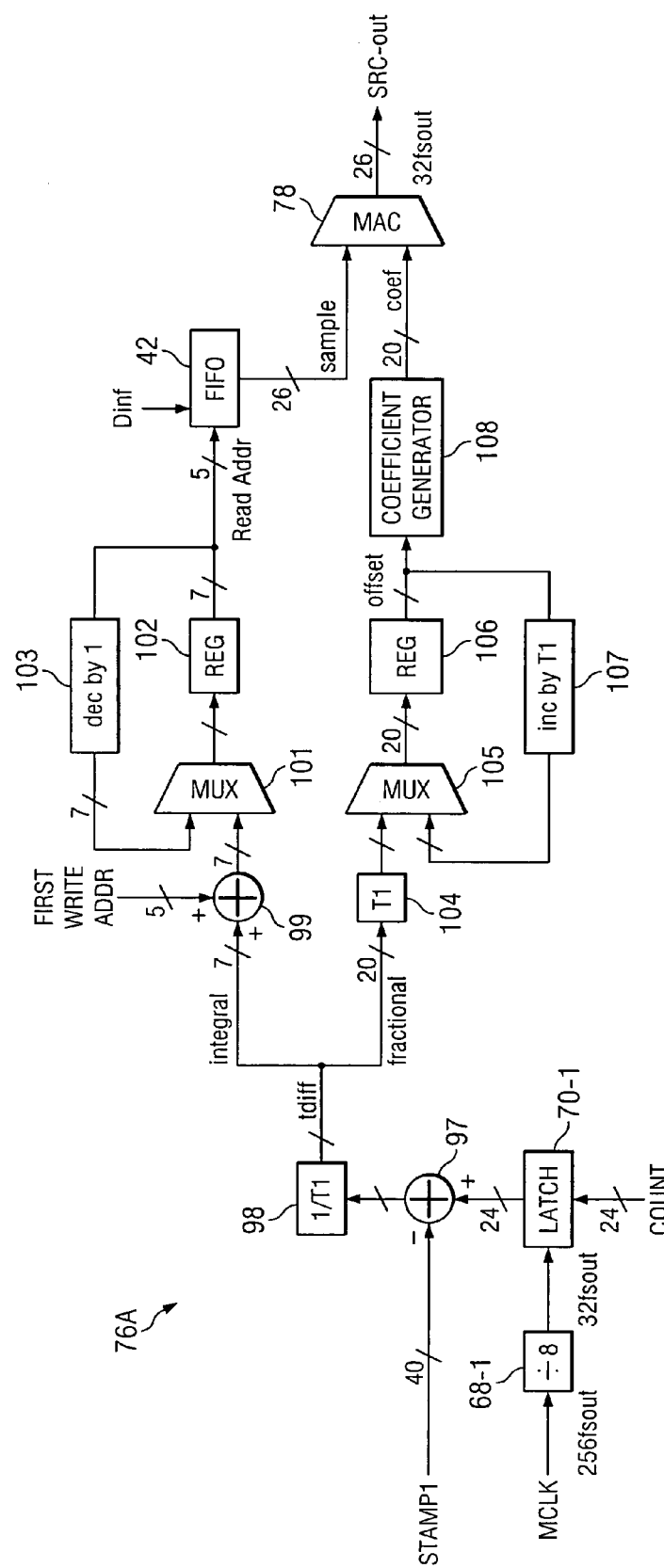
FIG. 4B is a detailed block diagram including circuitry of the coefficient address generator in block 76 of FIG. 4A.

The output of multiplier 73 is connected to another input of adder 72, which produces a time stamp signal STAMP1 that is applied to an input of a coefficient address generator circuit 76, which is shown in FIG. 4B. The time stamp signal STAMP1 represents the time stamp or arrival time of the first sample of 8 audio output samples of interpolation filter 31-1 (the sample rate of which is 8fsin) to provide a signal having an output sample rate of 8fsin to be coupled to an input of FIFO memory 42 of SRC 32. The output of FIFO memory 42 then is up-sampled by a factor of 4 by zero order sample/hold circuit 66. The signals COUNT and T1 are applied to two additional inputs, respectively, of coefficient address generator 76. A first write address signal FIRST WRITE ADDR is applied to an input of coefficient address generator 76 and also to an input of FIFO memory 42. FIRST WRITE ADDR is the write address of the first sample of each group of 8 samples of data produced by interpolation filter 31-1.

An output of coefficient and address generator 76 conducts a 20-bit coefficient signal coef which is provided as an input to multiplication and accumulation circuit 78. FIFO memory 42 outputs data samples, at the rate 8fsin, to the input of a zero-order sample/hold (ZOS/H) circuit 66, the output of which provides samples at the rate of 32fsin to a data input of multiplication and accumulation circuit 78. The 26-bit output signal SRC-out produced by multiplication and accumulation circuit 78 has a 32fsout sample rate.

Referring to FIG. 4B, SRC filtering circuitry 76A includes the coefficient and address generator circuitry in block 76, FIFO 42, and multiplication and accumulation circuit (MAC) 78 of FIG. 4A. The coefficient and address circuitry portion includes a divide-by-8 circuit 68-1 which receives MCLK as an input and generates an output to the latching input of a 24-bit latch circuit 70-1. Latch circuit 70-1 also receives COUNT as an input. A 24-bit output of latch circuit 70-1, which represents the current time, is applied to the (+) input of an adder 97, the (−) input of which receives the 40-bit signal STAMP1 produced by loop filter 71 of FIG. 4A. The output of adder 97 is coupled to the input of a circuit 98 which divides the output of adder 97 by the value of the quantity T1 produced by multiplier 74 in FIG. 4A to produce the signal tdiff.

The output tdiff of circuit 98 represents, in essence, the timing difference between the corresponding audio input signals having 32fsin sample rates and audio output signals having 32fsout sample rates. The time difference signal tdiff includes a 7-bit integral portion applied to the (+) input of an adder 99 and a 20-bit fractional portion coupled to the input of a multiplier circuit 104 which multiplies the fractional portion by T1. Another (+) input of adder 99 receives the 7-bit FIRST WRITE ADDR signal. The 7-bit output of adder 99 is coupled to one input of multiplexer 101. The output of multiplexer 101 is connected to the input of a register 102. The most significant 5 bits of the 7-bit output of register 102 are connected to the read address input of FIFO memory 42. All 7 output bits of register 102 are fed back to the input of a decrement by 1 circuit 103, the 7-bit output of which is connected to another input of multiplexer 101. As previously mentioned, the input of FIFO memory 42 receives the digital input signal Dinf produced by interpolation filter 31-1 of FIG. 4A. The 26-bit output of FIFO 42 is connected to one input of MAC circuit 78 (i.e., multiplication and accumulation circuit 78), the output of which produces the signal SRC-out at a sample rate of 32fsout.

The output of multiplier 104 is applied to one input of multiplexer 105, the 20-bit output of which is connected to the input of a register 106. The output of register 106 is coupled to the input of a coefficient generating circuit 108 and to the input of an increment-by-T1 circuit 107, the output of which is connected to another input of multiplexer 105. Coefficient generator circuit 108 produces a 20-bit output coef which is applied to the other input of MAC circuit 78.

Divider 68-1 and latch 70-1 establish the sample rate of the SRC output signal SRC-out produced by SRC 32. The signal latched into latch 70-1 can be considered to represent the current time, if counter 68 in FIG. 4A is considered to be a timer. The difference between the 24-bit output of latch 70-1 and the value of the 40-bit time stamp signal STAMP1 then is divided by T1 to produce the above mentioned timing difference signal tdiff.

Still referring to FIG. 4B, the sum of the FIRST WRITE ADDRESS and the integral portion of timing difference signal tdiff is multiplexed into register 102, to be used in the filtering of an initial sample of the digital input data Dinf. For a second sample of Dinf to be filtered, the output of register 102 is decremented by 1 and then multiplexed back into register 102. The read address is determined by adding the FIRST WRITE ADDR signal to the integral portion of tdiff and result is entered into register 102, and the following read address is decremented by 1. The read address produced at the output of register 102 is obtained by dropping the two LSBs (least significant bits) of the contents of register 102 to convert from 7-bit write address words to 5-bit read address words that are used to read out audio data samples from FIFO 42.

Figure 4C:
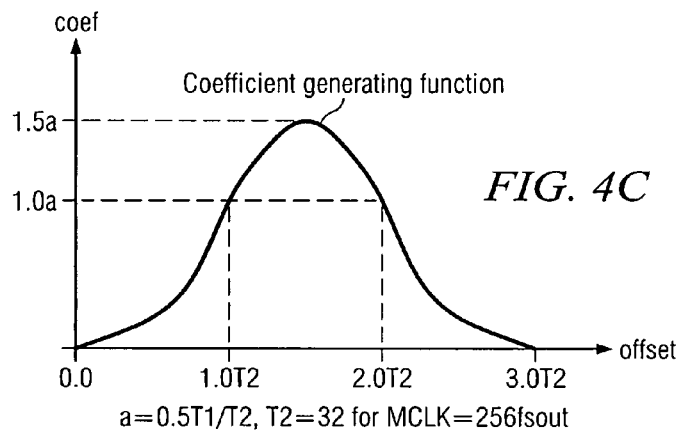
FIG. 4C is a graph of the coefficient generating function produced by the coefficient address generator in of FIG. 4B.

Meanwhile, 20-bit coefficients (i.e., values of the signal "coef") are being generated at the same time. The 20-bit fractional portion of the timing difference tdiff is multiplied by T1 (the estimated period of 32fsin) and that result is multiplexed into register 106. The output signal "offset" of register 106 is input to coefficient generator 108, which calculates points of the coefficient generating function curve shown in FIG. 4C, and also is incremented by T1 and fed back to the other input of multiplexer 105. The previously described function h(t) indicated in FIG. 2B is utilized to generate the coefficients coef which are represented by the curve in FIG. 4C. Subsequent coefficients for successive points of the coefficient generating function curve of FIG. 4C are generated by incrementing the feedback from register 106 by the period T1 of 32fsin.

MAC circuit 78 operates by initially being reset to zero. When the first filtered audio sample of Dinf is received out of FIFO memory 42, it is multiplied by the first coefficient from coefficient generator 108. That result is added to the previous value in MAC circuit 78, the initial previous value being zero, to generate the first value accumulated in MAC circuit 78. Then, the next audio data sample out of FIFO 42 is multiplied by the next value of coef and the result is added to, i.e., accumulated with, the previous value in MAC circuit 78 to produce the next accumulated value, and so on, until 8 Dinf samples from FIFO 42 have been multiplied by corresponding coefficients coef from coefficient generator 108 and then accumulated.

The final value accumulated in MAC circuit 78 then is output as the next value of the 26-bit SRC digital output signal SRC-out, with a sample rate 32fsout.

It should be appreciated that the read address generation and coefficient generation circuitry is clocked by MCLK, so for an output sample rate of 32fsout there are 8 MCLK clock cycles for the 8 audio data samples successively output by FIFO 42 and processed by MAC circuit 78 to generate each value of SRC-out.

Figure 4D:
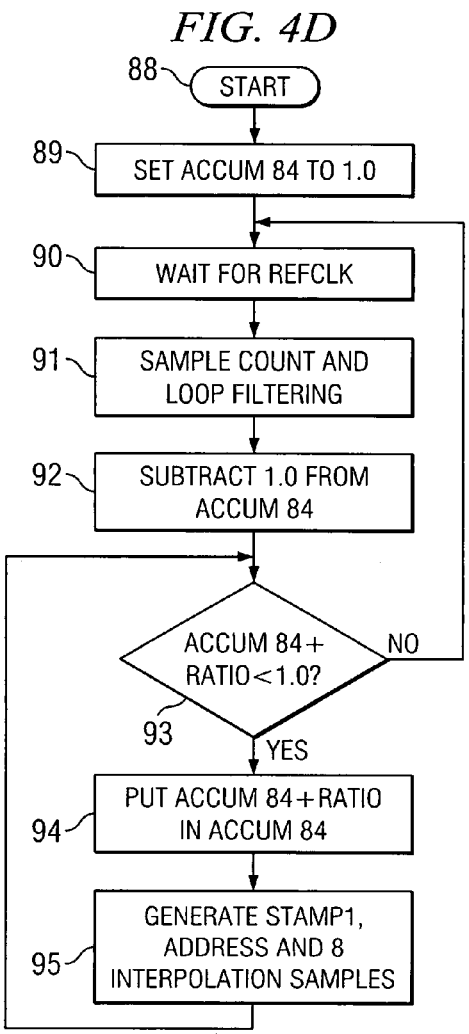
FIG. 4D is a flow chart which illustrates the sampling rate algorithm utilized in accordance with the present invention.

Referring next to the interpolation flow chart of FIG. 4D, it shows how the information and samples of Dinf are set up to accomplish the sample rate conversion which occurs in the circuitry of FIGS. 4A and 4B. The circuitry of FIG. 4B operates on the information received from circuitry in FIG. 4A. The preparation procedure starts at label 88, and in block 89 the value 1.0 is set into accumulator 84. As indicated in block 90, the process waits for the next rising edge of REFCLK. Then, as indicated in block 91, the value of COUNT is latched into latch 70 in FIG. 4A by the rising edge of REFCLK, and filtering of the new values of COUNT from the output of latch 70 is accomplished by means of loop filter 71 to generate new values of STAMPR (representing the arrival times of the rising edges of REFCLK) and TR (representing the estimated period of REFCLK). Then, as indicated in block 92, the value 1.0 is subtracted from the content of accumulator 84 by means of adder 82 and the "1" input of multiplexer 83 in FIG. 4A.

Then, as indicated in decision block 93, a determination is made as to whether the present content of accumulator 84 plus the value RATIO is less than 1.0. If this determination is affirmative, then, as indicated in block 94, the sum of the present content of accumulator 84 and the value RATIO is stored into accumulator 84 by means of the value RATIO which occurs on conductor 75A, which is connected to the "1" input of multiplexer 81. At the same time, the value TR is multiplied by RATIO to generate T1 (which is the precisely estimated period of 32fsin) and STAMP1, which is the time of arrival of the first audio input sample of the 8 samples to be written into FIFO 42. In order to ultimately generate the next value of SRC-out, TR is multiplied by the signal 75A and the result is added to STAMPR to generate STAMP1. At the same time, Dinf is being filtered by means of interpolation filter 31-1.

If the determination of decision block 93 is negative, meaning that the sum of accumulator 84 and RATIO is not less than 1.0, then the process returns to block 90 and waits for the next rising edge of REFCLK, and after it arrives the processes of blocks 91 and 92 are repeated and the procedure then reenters decision block 93.

It should be appreciated that at each MCLK time the signal 75A may change, and each time it changes, it is necessary to re-calculate STAMP1. Whenever decision circuit 79 in FIG. 4A determines that the value of the signal 75A is less than 1.0, then that value of the signal 75A is loaded through multiplexers 81 and 83 into accumulator 84. Also, each time decision circuit 79 indicates less than 1.0, address generator 80 in FIG. 4A increments WRITE ADDR by 1 for the next 8 filtered audio data samples from interpolation filter 31-1 to be written sequentially into FIFO 42. The content of decision circuit 79 is changed by the value of signal 75A, which is equal to the sum of RATIO and accumulator 84.

If the process of FIG. 4D checks accumulator 84 in block 93 and determines that the sum of accumulator 84 and RATIO is less than 1.0, then the process of blocks 94 and 95 is repeated, and if the sum is not less than 1.0, i.e., if the value of signal 75A is equal to or greater than 1.0, then the path through conductor 85 and the "0" input of multiplexer 81 is selected to reload the contents of accumulator 84 into itself, which means accumulator 84 holds its present value without any change. The circuitry of FIG. 4B is always operating in response to MCLK, irrespective of REFCLK, and never goes into the idle mode. (The purpose of REFCLK is to update STAMP1, T1, WRITE ADDR, and interpolation filter 31-1.) However, all of the circuitry in FIG. 4A except the coefficient and address generator 76 and the multiplication and accumulation circuitry 78 does go into the idle mode if the value of the signal 75A is greater than or equal to 1.0 and it has finished preparing the information for the processing to be performed by the circuitry in FIG. 4B.

Thus, the flowchart of FIG. 4D sets up the information needed for the filtering by the circuitry shown in FIG. 4B so as to advance and process the digital audio data samples and corresponding coefficient values into MAC circuit 78 to be combined, respectively, so as to accumulate the respective multiplication products needed to provide each value of SRC-out at a sample rate of 32fsout.

Thus, when a rising edge of REFCLK arrives, −1.0 is added into accumulator 84. Otherwise, when an audio sample is played, the positive number RATIO is added into accumulator 84 until the content of accumulator 84 approaches but is not above 1.0. When the content of accumulator 84 exceeds 1.0, "playing" of the audio samples stops and waits for the arrival of a positive edge of REFCLK. When it arrives, 1.0 is subtracted from the content of accumulator 84 and then playing of the audio sample data continues. The output of adder 82 indicates that 1.0 has been subtracted from the content of accumulator 84, and is connected to the "1" input of multiplexer circuit 83.

A signal FIRST WRITE ADDR is applied to another input of coefficient address generator 76 and to a write address input of a first FIFO (first in, first out) memory 42, which can be implemented by means of a random access memory (RAM). The signal FIRST WRITE ADDR is generated whenever a sample is generated by the interpolation filter 31-1 continuously with 5 bits (for a total 32 word memory space, for example, 0, 1, 2, . . . , 31.) A digital data input signal Din is applied to an input of interpolation filter 31-1, and is up-sampled by a factor of 8. An output of interpolation filter 31-1 produces a higher input sampling rate 8fsin which is applied to a data input of FIFO 42. Coefficient address generator circuit 76 produces a read address signal READ ADDRESS, which is applied to a corresponding read address input of FIFO 42. During a read operation, FIFO 42 produces a sample output signal SAMPLES of a total of 8 samples at the output of up by 4 zero-order sample/hold circuit 66 are used to calculate each SRC output sample. So equivalently, 2 samples from FIFO are used, which is applied to an input of multiplication and accumulation circuitry 78. A coefficient output signal coef produced by coefficient address generator 76 is applied to a corresponding input of multiplication and accumulation circuitry 78, the output of which produces the output of asynchronous SRC 32, with a sample rate of 32fsout. (Multiplication and accumulation circuit 78 of FIGS. 4A and 4B is conventional and can be readily implemented by those skilled in the art.)

At each rising edge of reference clock signal REFCLK, the output COUNT of counter 68 is latched, and the latch output is provided as an input to loop filter 71. Counter 68 is driven by above mentioned master clock signal MCLK, which is derived from the same free-running on-chip oscillator 63 that also clocks analog DAC 35. Loop filter 71 estimates the frequency of reference clock REFCLK and filters out jitter. Then the value RATIO of the ratio between the frequency of REFCLK and the frequency of fsin is used to calculate period of the audio input sampling rate 32fsin and the sampling time STAMP1 based on outputs of loop filter 71, which are related to the frequency of REFCLK. In this example of the present invention, and as subsequently explained with respect to FIG.

5, MCLK is set equal to 256fsout. The rate of REFCLK is estimated from the loop filter by low-pass filtering REFCLK by using MCLK. The relation between REFCLK and the incoming audio sampling rate fsin is given by their frequency ratio, RATIO. Based on these relations, SRC 32 converts the audio samples from 32fsin to 32fsout (Note that the reference clock can be a low frequency clock only if the ratio between the reference clock and the audio input sampling rate fsin is provided and if the ratio value RATIO is not required to be a rational number and can be any fractional number within a certain range.)

Decision circuit 79 determines whether to start operation of interpolation filter 31-1 by subtracting 1.0 from the content of decision circuit 79, and if the sum of the accumulator content and the value of the constant value RATIO is less than 1.0, then the determination is affirmative, and the sum is stored into decision circuit 79 and the operation of interpolation filter 31-1 is started. As subsequently explained with reference to FIG. 5, the output sample frequency 128fsout is determined by the rate of free-running oscillator 63, which controls the operating rate of analog DAC 35. At the very beginning of the system startup, the oscillator frequency typically will be calibrated to approximately 50 mHz. Since the oscillator calibration may not be accurate, and since oscillator 63 free-runs after calibration, the output sampling rate 128fsout derived from oscillator 63 is approximately, but not exactly, equal to 1024*48 kHz. SRC 32 asynchronously translates the audio input sample rate from 32fsin to the output sampling rate 32fsout by, in effect, comparing the frequency of OSCLK against the frequency of REFCLK and, in effect, comparing the ratio settings for the audio data sampling rate ratio value RATIO against the frequency of REFCLK. This is how SRC 32 converts the sample rate from 32fsin to 32fsout by estimating the ratio of the frequency of REFCLK relative to fsout, so that the relationship between fsin and fsout is known because of the known ratio between REFCLK and fsin.

8 samples then are generated at the output of interpolation filter 31-1 and are transferred to FIFO memory 42. Then the necessary multiplication and accumulation operations are applied to the samples by circuitry in block 78 to generate the SRC output samples at the rate of 32 fsout. The calculation of the period T1 of the input sampling rate fsin is determined by the contents of counter 68. However, if the sum in decision circuit 79 is equal to or greater than 1.0, the logic circuitry including coefficient address generator 76, address generator 80, FIFO 42, and all of the circuitry in FIG. 4A except the coefficient and address generator 76 and the multiplication and accumulation circuitry 78 remain idle until the next pulse of REFCLK arrives.

Figure 5:
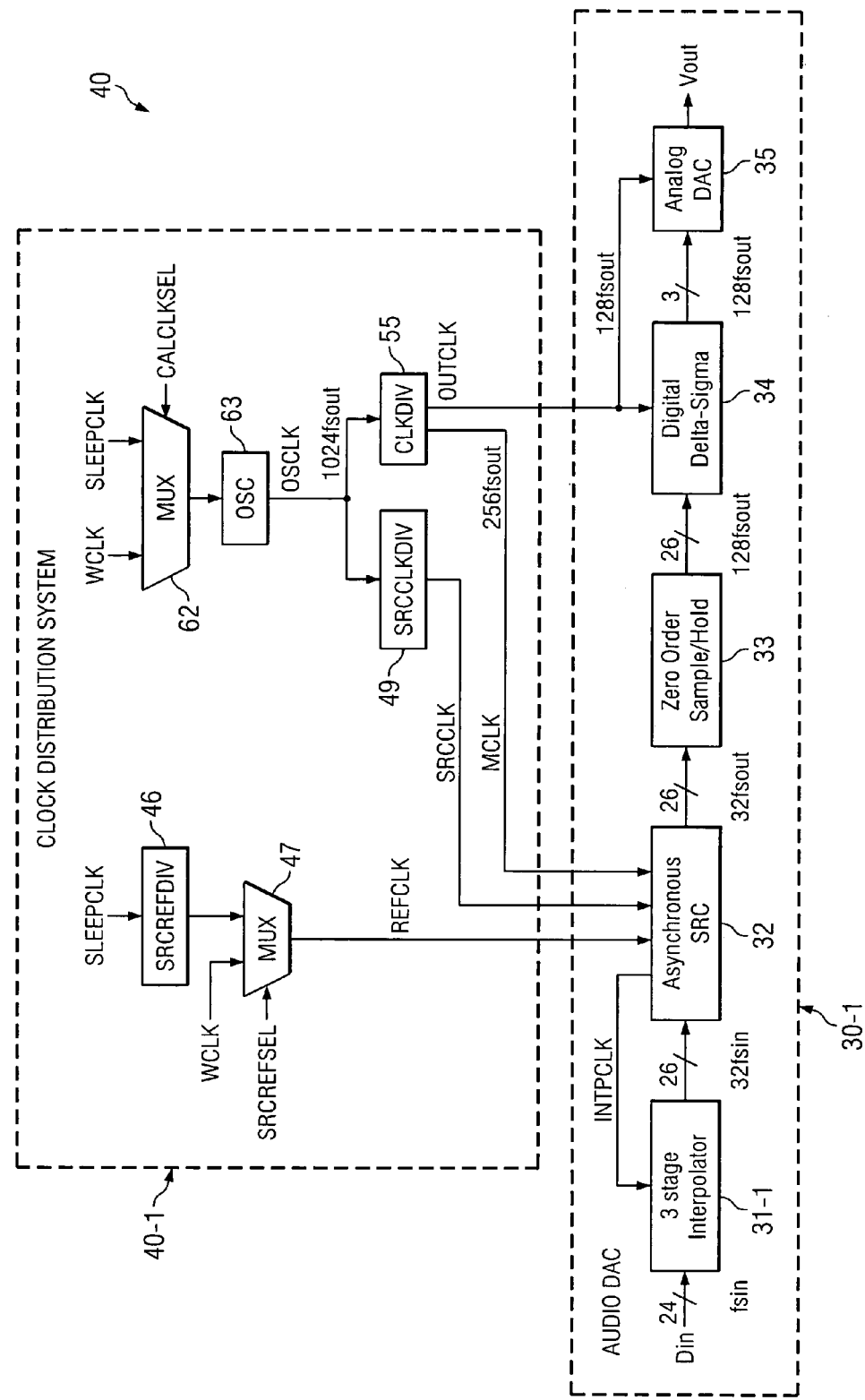
FIG. 5 is a more detailed block diagram of an implementation of the audio DAC shown in FIG. 3.

Referring to FIG. 5, a "flexible" or "multipurpose" integrated circuit audio DAC 40, preferably formed on a single chip, includes the audio DAC 30-1 shown in FIG. 3 and a clock distribution system 40-1. As shown in FIG. 3, audio DAC 30-1 includes interpolation filter 31-1, asynchronous SRC 32, ZOH interpolator 33, digital delta-sigma modulator 34, and analog DAC 35. The various clock input signals required by above audio DAC 30-1 are generated in clock distribution system 40-1 in FIG. 5.

Clock distribution system 40-1 includes circuitry 46,47 which generates reference clock REFCLK from either SLEEPCLK or WCLK, and also includes circuitry which generates SRC clock signal SRCCLK, the 256fsout clock signal MCLK, and the 128fsout clock signal used to control digital delta-sigma modulator 34 and analog DAC 35 from oscillator clock signal OSCLK.

OSCLK is produced by a circuit including multiplexer 62 and a free-running oscillator 63. Multiplexer 62 receives SLEEPCLK and WCLK, one of which is selected in response to a reference frequency selection signal CALCLKSEL, and generates a calibration reference signal that is identical to either SLEEPCLK or WCLK. After the calibration of oscillator 63 is complete, free-running oscillator 63 then remains calibrated to the selected frequency free-runs to produce OSCCLK at the calibrated frequency, subject to drift due to variations in temperature, power supply voltage, etc. (WCLK is a "word clock", wherein each serial data word comes in during one cycle of WCLK. In the burst mode, the serial data may come in at very fast but irregular speeds. For flexibility, audio DAC 40 also can handle the incoming audio data in a "regular" mode, i.e., at a fixed speed, in which case WCLK can be used, instead of SLEEPCLK, as reference clock REFCLK. Another FIFO (not shown) could be used to store the audio samples ahead of asynchronous SRC 32 or interpolator 31-1 for temporarily storing input data received in either the regular mode or the burst mode.)

The audio DAC user typically requires a high accuracy of the audio play back rate, which can not be guaranteed because of the above mentioned thermal drift of free-running oscillator 63. The drift typically is caused by the environment temperature change. (For example, the integrated circuit chip becomes hotter after audio DAC 40 runs for a while and causes oscillator 63 to run faster. Furthermore, the supply voltage level produced by a battery decreases after being used for a while, which also causes oscillator 13 to run faster.) Consequently, the frequency of OSCLK is not exactly the same rate as the sample rate of the incoming audio data. Audio DAC 40 uses SRC 32 to convert the fixed audio input sample rate 32fsin to an asynchronous audio output sample rate 32fsout, and plays the audio output data at the 128fsout rate derived from the signal OSCLK produced by drift-prone oscillator 63, which in this example has a nominal frequency of 1024fsout.

Clock distribution system 40-1 applies oscillator output signal OSCLK to the inputs of a first clock divider circuit 49 and a second clock divider circuit 55. The output of a first divider circuit 49 produces an SRC clock signal SRCCLK which is applied to asynchronous SRC 32. SRCCLK functions directly as an operating clock for estimating circuits 32A and 32B in FIG. 4A, and indirectly for interpolation filter 31-1. One output of a second divider circuit 55 generates the above mentioned operating clock MCLK with a rate of 256fsout (in this example) which is applied to a clock input of SRC 32. The other output of divider 55 produces a clock signal OUTCLK which, in this example has a rate of 128 fsout, and which is applied to clock inputs of digital delta-sigma modulator 34 and analog DAC 35, respectively.

Above-mentioned circuitry 46,47 a SRC reference clock divider circuit 46 divides SLEEPCLK by a suitable number and then applies the result to one input of a multiplexer 47. The other input of multiplexer 47 is connected to receive word clock WCLK. The reference clock selection signal SRCREFSEL is connected to a selection input of multiplexer 47, the output of which is the reference clock REFCLK. REFCLK is connected to a reference clock input of asynchronous SRC 32. Ordinarily REFCLK would be exactly equal to SLEEPCLK, but for flexibility WCLK can be selected as the reference clock REFCLK if desired.

In the operation of audio DAC 40, interpolation filter 31-1 and asynchronous SRC 32 receive Din at the sample rate fsin. The basic idea is that SRC 32 uses MCLK (256fsout), which is based on OSCLK (1024fsout), to estimate the REFCLK rate 1/TR and also to convert the audio input data sample rate from fsin to an output sample rate proportional to fsout (i.e., to 128fsout) by using the estimated TR (i.e., the period of REFCLK) and the provided ratio value RATIO of equal to (1/TR)÷fsin.

For example, the input sample rate might be either 44.1 kilohertz or 48 kHz relative to the frequency of reference clock REFCLK, and the center frequency for oscillator 63 would be 1024 times 48 kHz or 1024 times 44.1 kHz. If the ratio of the frequency 1/TR of REFCLK to fsin is given, and the ratio of the frequency 1/TR of REFCLK to fsout is estimated, audio DAC 40 can sample the incoming audio data Din at a rate fsin and play it back at the correct sampling rate of 128 fsout. For example, if the audio data comes in at a sample rate of 44.1 kHz, and if for example, the audio data represented by DIN is a 1 kHz audio tone, and if SRC 32 is bypassed or disabled, and if oscillator 63 is calibrated to operate at 44.1 kHz, then the output of analog DAC 35 produces the same 1 kHz audio tone. However, since the frequency of oscillator 63 may drift away from 44.1 kHz, for example to 45 kHz, this will cause the 1 kHz tone produced by DAC 35 to also drift, in proportion to 45÷44.1 kHz. SRC 32 in effect monitors the clock rate of analog DAC 35 by using REFCLK as its reference frequency and therefore "knows" what the sample rate 128fsout for the audio data is, and automatically converts the audio data sample rate 32fsin into the sample rate 32fsout, which is synchronized with respect to the 128fsout sample rate at which analog DAC 35 operates. This prevents any drift or "tone shaping" of the audio output signal Vout produced by analog DAC 35 due to drift of the frequency of OSCLK.

A novel aspect of the above described embodiments of the invention regards the use of a clock signal such as REFCLK, which has no relationship to the audio input sample rate fsin, in conjunction with the asynchronous SRC 32, to control the analog DAC 35. That is in direct contrast to the prior art, in which the clock signal that controls the analog DAC portion of an audio DAC is directly related to the input audio sampling rate fsin.

Another novel aspect of the described embodiments of the present invention is operating the analog DAC from a clock signal generated by a free-running oscillator, preferably on the same chip. The audio DAC architecture of the present invention allows one or more audio DACs to play back one or more audio input signals having different audio sample rates without causing the previously described sample dropping or sample repeating of the audio output, even though the reference clock frequency is not locked in synchronization with the sampling rate of the audio output data. This makes it convenient for the audio DAC to play back audio data having different sampling rates.

Also, for the audio DAC of the present invention it is not necessary to provide a separate input signal which represents the audio input sample rate fsin. Instead, the rate of a reference clock such as REFCLK is known, and the ratio of its sampling rate (1/TR) to the audio input sampling rate fsin signal is provided as an input, and an internal on-chip oscillator is used as the only clock source for the filtering, sample rate conversion, estimation of the input sample rate (fsin), and digital to analog conversion.

Thus, the invention provides an audio DAC including an asynchronous SRC, an analog DAC, and features which enable the audio DAC to run without having an input signal that represents the input audio sample rate, so the analog DAC can be operated at an audio output sampling rate that is unrelated to and asynchronous with respect to the audio input sampling rate fsin. The asynchronous SRC converts the audio input sampling rate to the unrelated/unsynchronized audio output sample rate for the analog DAC, which is clocked by a free-running on-chip oscillator. The audio input sample rate fsin is determined by the frequency of the reference clock REFCLK and a ratio of the frequency of reference clock REFCLK, i.e., 1/TR to the input sample rate fsin.

The advantages of the present invention include improved quality of the audio signal, relatively easy implementation of the interpolation circuitry in the SRC, and making utilization of audio DACs easier than the prior art by avoiding the need for the audio DAC operating frequency to be locked in synchronization with the input sample rate fsin of the audio input data. Another benefit from the present invention is that the reference signal related to the audio input data sample rate fsin does not have to be exactly the same as the audio input sample rate. Instead, any rate of its can be used as long as the ratio of the reference signal frequency to the audio sample rate fsin is provided as an input.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A digital conversion circuit receiving digital input data at a first sample rate, the digital conversion circuit comprising:
    (a) a first estimating circuit receiving a reference clock signal and a first clock signal unrelated to the reference clock signal for generating a first signal in synchronization with the first clock signal and representative of a period of the reference clock signal and for generating a second signal in synchronization with the first clock signal and representative of a time of arrival of a particular edge of the reference clock signal;
    (b) a second estimating circuit for operating on the first signal, the second signal, and an input value which represents a predetermined ratio of the frequency of the reference clock signal divided by the first sample rate to generate a third signal which represents a period of the first sample rate and a fourth signal that represents a time of arrival of a group of sample of the digital input data;
    (c) a coefficient and address generation circuit receiving the third and fourth signals for generating a read address signal and a coefficient signal;
    (d) a FIFO memory having an input coupled to receive the digital input signal and a read address input for receiving the read address signal; and
    (e) a multiplication/accumulation circuit for receiving the coefficient signal and digital data samples output by the FIFO memory, multiplying the digital data samples output by the FIFO memory by corresponding coefficients output by the coefficient and address generation circuit, accumulating resulting multiplication products, and producing a digital output signal including accumulated multiplication products and having an output sample rate that is synchronized with the first clock signal.

2. The digital conversion circuit of claim 1 wherein the first clock signal is derived from a signal produced by a clock signal derived from a signal produced by a free-running oscillator.

3. The digital conversion circuit of claim 2 wherein the free-running oscillator is included on an integrated circuit chip with elements (a)-(d).

4. The digital conversion circuit of claim 1 wherein the first estimating circuit includes a counter clocked by the first clock signal producing a counter output signal coupled to a data input of a latch circuit, an edge detection circuit having an input receiving the reference clock signal and an output coupled to a latching input of the latch circuit, and a loop filter having an input coupled to an output of the latch circuit, a first output on which the first signal is produced, and a second output on which the second signal is produced.

5. The digital conversion circuit of claim 4 wherein the second estimating circuit includes an input for receiving the input value which represents the predetermined ratio of the frequency of the reference clock signal divided by the first sample rate, and also includes a first multiplier which multiplies the first signal by the input value to generate the third signal.

6. The digital conversion circuit of claim 5 wherein the second estimating circuit includes a first adder having a first input coupled to receive the input value and an output coupled to a first input of a second multiplier having a second input coupled to receive the first signal and an output coupled to a first input of a second adder having a second input coupled to receive the second signal and an output on which the fourth signal is produced, the output of the first adder also being coupled to a first input of a first multiplexer and an input of a decision circuit having an output coupled to a selection input of the first multiplexer, the first multiplexer having an output coupled to a first input of a second multiplexer, the second multiplexer having an output coupled to an input of an accumulator, the accumulator having an output coupled to a second input of the first adder, to a second input of the first multiplexer, and to a first input of a third adder having a second input coupled to receive a value −1.0 and an output coupled to a second input of the second multiplexer, the decision circuit producing an output signal indicative of whether the contents of the decision circuit is less than 1.0.

7. The digital conversion circuit of claim 6 wherein the first and third adders, the decision circuit, and the accumulator, and the first and second multiplexers co-act to perform the function of generating timing information for operating on the digital input data based on the sample clock and the first signal.

8. The digital conversion circuit of claim 5 wherein the coefficient and address generation circuit includes a divider circuit which divides the first clock signal to produce an output clock signal having the first sample rate coupled to a latching input of a second latch circuit, the second latch circuit having an input coupled to receive the counter output signal and an output coupled to a (+) input of a first adder having a (−) input coupled to receive the fourth signal, the first adder having an output which is divided by the third signal to produce a timing difference signal which includes an integral portion coupled to address generating circuitry of the coefficient and address generation circuit and a fractional portion coupled to coefficient generating circuitry of the coefficient and address generation circuit.

9. The digital conversion circuit of claim 8 wherein the address generating circuitry includes a multiplexer having a first input coupled to receive a sum of a first write address and the integral portion of the timing difference signal and an output coupled to an input of a register having an output coupled to a read address input of the FIFO memory and to an input of a decrement by 1 circuit, the decrement by 1 circuit being coupled to a second input of the multiplexer.

10. The digital conversion circuit of claim 8 wherein the coefficient generating circuitry includes a multiplexer having a first input coupled to receive a product of the fractional portion of the timing difference signal and the third signal and an output coupled to an input of a register having an output coupled to an input of a coefficient generator and to an input of an incrementing circuit which increments by the value of the third signal, the incrementing circuit being coupled to a second input of the multiplexer, an output of the coefficient generator generating the coefficients.

11. The digital conversion circuit of claim 10 wherein the coefficient generator generates coefficient signals in accordance with an impulse response of a third-order continuous-time comb filter, represented by the expressions

| | |
|---|---|
| h(t) = 0.0 | for τ < 0.0 |
| h(t) = α * τ² | for 0.0 ≦ τ < 1.0 |
| h(t) = α(1.5 − 2 (τ − 1.5)²) | for 1.0 ≦ τ < 2.0 |
| h(t) = α(3 − τ)² | for 2.0 ≦ τ < 3.0 |
| h(t) = 0.0 | for ≧ 3.0, | where α≦0.5*T1/T2 and τ=t/T2, and where T1=1/(32fsin), T2=1/(32fsout), and wherein 32fsin is the first input sample rate and 32fsout is the output sample rate.

12. The digital conversion circuit of claim 2 including an analog DAC (digital to analog converter) coupled to receive digital information representative of the accumulated multiplication products and converting the digital information to an analog output signal representative of the digital input data, the analog DAC operating at a frequency that is unrelated to and not synchronous with respect to the input sample rate.

13. The digital conversion circuit of claim 12 including a digital delta-sigma modulator for receiving the digital information and generating a reduced-width digital output signal coupled to an input of the analog DAC, the reduced-width digital output signal generated by the digital delta-sigma modulator having fewer bits than the digital output signal produced by the multiplication/accumulation circuit.

14. The digital conversion circuit of claim 13 wherein the digital delta-sigma modulator and the analog DAC are clocked by a signal which is derived from the signal produced by the free-running oscillator.

15. A method of operating a digital conversion circuit receiving digital input data having a first sample rate, the method comprising:
(a) generating both a first signal representative of a period of a reference clock signal in synchronization with a first clock signal unrelated to the reference clock signal and a second signal in synchronization with the first clock signal and representative of a time of arrival of a particular edge of the reference clock signal by latching outputs of a counter triggered by the first clock signal into a first latch circuit in response to the reference clock signal and filtering outputs of the latch circuit;
(b) generating a third signal which represents a period of the first sample rate by multiplying the first signal by an input value which represents a predetermined ratio of the frequency of the reference clock signal divided by the first sample rate, and operating on the first signal and the second signal to generate a fourth signal that represents a time of arrival of a group of samples of the digital input data;
(c) operating on the third and fourth signals to generate read address signals and coefficient signals;
(d) applying the read address signals to a FIFO memory having an input coupled to receive the digital input data; and (e) multiplying digital data samples output by the FIFO memory by corresponding coefficients, accumulating the resulting multiplication products, and producing a digital output signal including accumulated multiplication products and having an output sample rate that is synchronized with the first clock signal.

16. The method of claim 15 including deriving the first clock signal from a signal produced by a free-running oscillator.

17. The method of claim 16 including dividing the first clock signal to produce an output clock signal having a sample rate and latching outputs of the counter, subtracting outputs of a second latch circuit from the fourth signal, dividing the resulting difference by the third signal to produce a timing difference signal which includes an integral portion and a fractional portion, using the integral portion to generate the read address signals, and using the fractional portion to generate the coefficient signals.

18. The method of claim 17 including adding the integral portion of the timing difference signal to write addresses and successively decrementing results of the adding to generate read addresses for successive samples of the digital input data, and multiplying the fractional portion of the timing difference signal by the third signal and successively incrementing the product of the multiplying by the third signal to produce inputs to a coefficient generator circuit to cause the coefficient generator circuit to generate coefficients for the successive samples of the digital input data, respectively.

19. The method of claim 15 including coupling the digital output signal to an input of an analog DAC (digital to analog converter) by means of a digital delta-sigma modulator both of which are clocked at a frequency that is unrelated to and not synchronous with respect to the input sample rate to produce an analog output signal representative of the digital input signal.

20. A digital conversion circuit receiving digital input data having a first sample rate, comprising:
(a) means for generating both a first signal representative of a period of a reference clock signal in synchronization with a first clock signal unrelated to the reference clock signal and a second signal in synchronization with the first clock signal and representative of a time of arrival of a particular edge of the reference clock signal by latching outputs of a counter triggered by the first clock signal into a latch circuit in response to the reference clock signal and filtering outputs of the latch circuit;
(b) means for generating a third signal which represents a period of the first sample rate by multiplying the first signal by an input value which represents a predetermined ratio of the frequency of the reference clock signal divided by the first sample rate, and operating on the first signal and the second signal to generate a fourth signal that represents a time of arrival of a group of samples of the digital input data;
(c) means for operating on the third and fourth signals to generate read address signals and coefficient signals;
(d) means for applying the read address signals to a FIFO memory having an input coupled to receive the digital input data; and
(e) means for multiplying digital data samples output by the FIFO memory by corresponding coefficients, accumulating the resulting multiplication products, and producing a digital output signal including accumulated multiplication products and having an output sample rate that is synchronized with the first clock signal.

\* \* \* \* \*